(12) United States Patent
Espenschied et al.

(10) Patent No.: US 8,545,929 B2
(45) Date of Patent: Oct. 1, 2013

(54) METHOD FOR APPLYING A LIQUID COATING MATERIAL TO A SUBSTRATE

(75) Inventors: Kenneth S. Espenschied, Olmsted Township, OH (US); Patrick T. Hogan, San Marcos, CA (US); Jorge Cruz, Vista, CA (US); David Ruf, Carlsbad, CA (US)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 13/280,740

(22) Filed: Oct. 25, 2011

(65) Prior Publication Data

US 2012/0040088 A1 Feb. 16, 2012

Related U.S. Application Data

(63) Continuation of application No. 12/299,380, filed as application No. PCT/US2007/071759 on Jun. 21, 2007, now abandoned.

(60) Provisional application No. 60/806,024, filed on Jun. 28, 2006.

(51) Int. Cl.
*H05K 3/00* (2006.01)

(52) U.S. Cl.
CPC ....................................... *H05K 3/00* (2013.01)
USPC ............................. 427/8; 427/96.4; 427/427.3

(58) Field of Classification Search
CPC ....................................................... H05K 3/00
USPC ............. 427/8, 96.1–96.4, 421.1–424, 427.3
See application file for complete search history.

(56) References Cited

U.S. PATENT DOCUMENTS

| | | | | |
|---|---|---|---|---|
| 4,830,922 A | * | 5/1989 | Sparrowhawk et al. | ... 428/411.1 |
| 5,017,409 A | * | 5/1991 | Bok | 427/96.4 |
| 5,065,695 A | * | 11/1991 | Baron et al. | 118/688 |
| 5,246,730 A | * | 9/1993 | Peirce et al. | 427/96.4 |
| 5,266,349 A | * | 11/1993 | Bok | 427/8 |
| 5,409,733 A | * | 4/1995 | Boger et al. | 427/96.4 |
| 5,687,092 A | * | 11/1997 | Bretmersky et al. | 702/100 |
| 6,726,773 B1 | | 4/2004 | Yanagita et al. | |
| 2003/0198734 A1 | * | 10/2003 | Mann | 427/96 |
| 2005/0095365 A1 | * | 5/2005 | Acum et al. | 427/421.1 |
| 2005/0095366 A1 | * | 5/2005 | Fang et al. | 427/421.1 |
| 2008/0099515 A1 | * | 5/2008 | Szuch | 222/504 |
| 2008/0166490 A1 | * | 7/2008 | Hogan et al. | 427/422 |
| 2009/0202709 A1 | * | 8/2009 | Szuch | 427/96.4 |

FOREIGN PATENT DOCUMENTS

| | | |
|---|---|---|
| JP | 53-068872 A | 6/1978 |
| JP | 05-168998 A | 7/1993 |
| JP | 05-190437 A | 7/1993 |
| JP | 8-338409 A | 12/1996 |
| JP | 2011513607 A | 4/1997 |
| JP | 2002-057443 A | 2/2002 |
| JP | 2004-122086 A | 4/2004 |
| JP | 2004-344743 A | 12/2004 |
| JP | 2007503982 A | 3/2005 |
| WO | 9713586 A1 | 4/1997 |

OTHER PUBLICATIONS

International Preliminary Report on Patentability for PCT/US2007/071759, Jan. 6, 2009, 5 pages.*
Official Action issued in Japanese Patent Application No. 2009-518469; 3 pages; Japanese Patent Office and English translation of the Office Action; Oct. 15, 2012.

* cited by examiner

*Primary Examiner* — William Phillip Fletcher, III
(74) *Attorney, Agent, or Firm* — Wood, Herron & Evans LLP

(57) ABSTRACT

Systems and methods for applying liquid coating materials to a substrate, such as an electronic component or circuit board. A control system of a coating system controls an applicator and a robot moving the applicator to apply the liquid coating material to the substrate in accordance with the information contained in a coating program. The control system determines a volume of liquid coating material actually dispensed onto the substrate during the coating program, and compares the dispensed volume to a desired dispensed volume of liquid coating material to produce an error signal representing the difference between the calculated and desired volume values. The control system uses the error signal to change the dispensed volume of liquid coating material on a subsequent substrate by a future coating program.

11 Claims, 1 Drawing Sheet

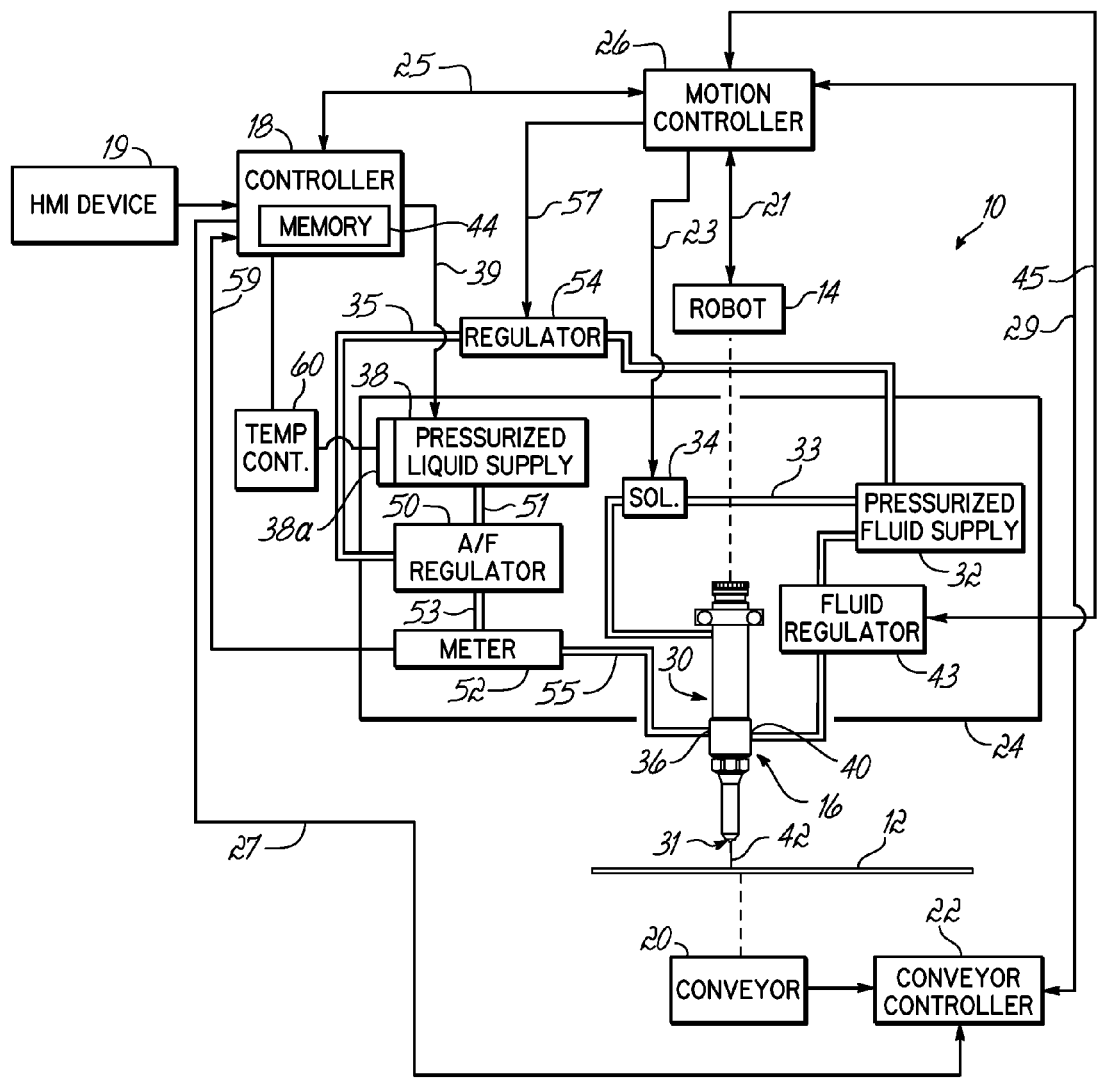

METHOD FOR APPLYING A LIQUID COATING MATERIAL TO A SUBSTRATE

CROSS-REFERENCE TO RELATED APPLICATIONS

This application is a continuation of U.S. application Ser. No. 12/299,380, filed Nov. 3, 2008,now abandoned, which is the National Stage of International Application No. PCT/US2007/071759, filed Jun. 21, 2007, which claims the benefit of U.S. Provisional Application No. 60/806,024, filed Jun. 28, 2006. The content of each of these applications is hereby incorporated by reference herein in its entirety for all purposes.

FIELD OF THE INVENTION

The present invention relates generally to dispensing liquid coating materials and, more particularly, to systems and methods for applying liquid coating material, such as a conformal coating material, to a substrate, such as a circuit board.

BACKGROUND OF THE INVENTION

Many industrial applications require the use of discrete, well-defined and uniform coatings applied to predetermined areas. Such coatings are very useful in varied processes, such as conformal coatings on non-uniform or irregular substrates like electronic circuit boards. In the production of discrete coatings for application to discrete substrate areas, for example, it is desirable to obtain broad, uniform coatings in a non-contact application process with sharp, square, cut-on and cut-off edges with no stringing of material. In particular, conformal coating material is used to protect selected components of a circuit board from moisture, dirt, etc.

When such coatings are dispensed, the volume of coating material dispensed onto the substrate may be controlled so that substantially the same amount of coating material is dispensed onto successive substrates during production. In one conventional coating material dispensing system, a flow meter is supplied in the line coupling the fluid supply with the dispensing valve. When the dispensing valve is opened, the volume of material dispensed is read using the encoder counts of the flow meter. The time interval during which the measured volume of material was dispensed is also determined and a volumetric flow rate is calculated. This calculated flow rate is compared to a set point representing a desired flow rate and, if necessary, a correction is made to adjust the actual flow rate towards the desired flow rate.

Conventional coating material dispensing systems may be inaccurate if used for applying conformal coating selectively to components or areas of a circuit board because the dispensing valve will only be opened for a very short time interval, perhaps as short as a few milliseconds. During the time interval that the dispensing valve is open, only a very small amount of coating material will be dispensed. The flow meter senses the small dispensed amount as a relatively small number of encoder counts.

Either the time interval, the number of encoder counts, or both, may be characterized by significant inaccuracies, which will result in an inaccurate calculation of flow rate. The system then compares the inaccurate calculated flow rate to the set point to produce an "error." Because of the inaccuracy, the error from the comparison may result in a correction of the wrong magnitude or even a correction in the wrong direction. Either result may cause an improper amount of coating material to be dispensed the next time the dispensing valve is opened. The result could easily be that the system produces so much inaccuracy it is of little practical value to the user.

Therefore, improved systems and methods for dispensing coating materials are needed that are not susceptible to such inaccuracies in the dispensed amount of coating material.

SUMMARY

In one embodiment, a system is provided for applying a liquid coating material to a substrate, such as a circuit board, as determined by a coating program. The system may comprise an applicator configured to receive the liquid coating material from a reservoir and configured to dispense the liquid coating material onto the substrate. A regulator is configured to regulate a flow of the liquid coating material to the applicator. A meter is configured to generate volume signals representing the volumes of liquid coating material flowing to the applicator. The system includes a robot configured to move the applicator relative to the substrate and a control system configured to access the coating program. The control system is configured to control the robot and the applicator to apply the liquid coating material to the substrate in accordance with information in the coating program. At completion of the coating program, the control system is configured to utilize one or more volume signals from the meter to determine a dispensed volume of the liquid coating material applied to the substrate during the coating program. The control system is further configured to compare the dispensed volume to a desired dispensed volume of the liquid coating material for the coating program and to produce an error signal representing the difference between the dispensed volume and the desired dispensed volume. The control system is configured to reduce the difference between the dispensed volume of the liquid coating material on a subsequent substrate and the desired dispensed volume based on the error signal.

In another embodiment, a method is provided for applying liquid coating material to a substrate as determined by a coating program. The method comprises dispensing the liquid coating material from an applicator to the substrate as directed by the coating program, determining a dispensed volume of the liquid coating material applied to the substrate after the coating program concludes, comparing the dispensed volume to a desired dispensed volume of the liquid coating material for the coating program, and producing an error signal representing the difference between the dispensed volume and the desired dispensed volume. The method further includes changing the dispensed volume of the liquid coating material applied to a subsequent substrate based upon the error signal.

BRIEF DESCRIPTION OF THE DRAWING

The accompanying drawings, which are incorporated in and constitute a part of this specification, illustrate exemplary embodiments of the invention and, together with a general description of embodiments of the invention given above, and the detailed description given below, serve to explain the principles of the embodiments of the invention.

The FIGURE is a schematic view of a computer-controlled coating system in accordance with an embodiment of the invention.

DETAILED DESCRIPTION

With reference to the FIGURE, a coating system 10 may be used to apply a liquid coating material, such as a conformal coating material, to a series of substrates, such as the representative substrate 12. Although the operation of a representative coating system 10 will be described herein, those skilled in the art will appreciate that a wide variety of other coating systems may be used to complete the method described below. The coating system 10 may be, for example, a Model SC-105, SC-205, or SC-400 conformal coating applicator commercially available from Asymtek (Carlsbad, Calif.).

In the representative embodiment, the coating system 10 includes a multi-axis electro-mechanical positioner or robot 14 and a conformal coating applicator 16 coupled with the robot 14. For example, the applicator 16 may be suspended from the robot 14 above the substrates 12. In one embodiment, the robot 14 is adapted to move the applicator 16 in directions defined within an X-Y-Z Cartesian coordinate frame to supply three degrees of freedom. The robot 14 includes a drive coupled to independently controllable motors (not shown) in a known manner. The applicator 16 is manipulated by robot 14 relative to the substrate 12 for applying amounts of liquid coating material to selected areas of the substrate 12.

A programmable controller 18 coordinates the movements and actuations of the coating system 10. The controller 18 may be a programmable logic controller (PLC), a microprocessor based controller, personal computer, or another conventional control device capable of carrying out the functions described herein as understood by a person having ordinary skill in the art. A human machine interface (HMI) device 19 is operatively connected to the controller 18 in a known manner. The HMI device 19 may include input devices and controls, such as a keypad, pushbuttons, control knobs, a touch screen, etc., and output devices, such as displays and other visual indicators, that are used by an operator to control the operation of the controller 18 and, thereby, control the operation of the coating system 10.

Substrates 12, for example, printed circuit boards with attached semiconductor die and other components, are supported in an operative relationship with the applicator 16 in a known manner and liquid coating material is applied from the applicator 16 onto selected areas on each substrate 12. Depending on the dispensing application, a series of substrates 12 as may be coated in a batch mode. Alternatively, the substrates 12 may be continuously transported past the applicator 16 on an automatic conveyor 20. The conveyor 20 has a conventional design and, furthermore, may have a width that can be adjusted to accommodate substrates 12 of different dimensions. The conveyor 20, which may also include pneumatically operated lift and lock mechanisms (not shown), receives command signals from a conveyor controller 22.

The applicator 16 is electrically coupled with an applicator controller 24, which supplies command signals that control the operation of the applicator 16. A motion controller 26 is electrically coupled by a communication link 21 with the robot 14. The solenoid 34 is electrically coupled by a communication link 23 with the motion controller 26. The conveyor controller 22 and motion controller 26 are also electrically coupled with controller 18 over respective communication links 25, 27. The motion controller 26 is electrically coupled over a communication link 29 with the conveyor controller 22. Thus, a programmable control system for coating system 10 includes the controller 18, the applicator controller 24, the motion controller 26, and the optional conveyor controller 22 as interconnected components that communicate with each other.

The motion controller 26 supplies command signals to the robot 14 over the communication link 21. The command signals are used by the robot 14 to control the position and/or velocity of the applicator 16. Generally, the robot 14 includes electric motors, such as servo motors or stepper motors, that drive the motion of the different axes of the robot 14.

Applicator 16 includes a body 30 suspended from the robot 14, a nozzle 31 mounted to one end of the body 30, and a flow control mechanism (not shown) disposed inside the body 30. The flow control mechanism inside body 30 may comprise an air-actuated needle, an air piston, and a valve seat that cooperate to form a dispensing valve (not shown) operative to control a flow of conformal coating material dispensed from the applicator 16. A pressurized fluid supply 32 and a solenoid 34 cooperate to supply pressurized fluid in a known manner to regulate the actuation of the dispensing valve inside the body 30. Specifically, the solenoid 34 controls air pressure in a conduit 33 connecting the pressurized fluid supply 32 with the applicator 16 so as to move the air piston and, thereby, move the needle relative to the valve seat to provide an opened position for the dispensing valve in which liquid coating material is dispensed from the applicator 16 onto the substrate 12. The solenoid 34 may vent the air pressure acting on the air piston to permit the needle to return to a closed position in which the needle contacts the valve seat to discontinue the dispensing.

The coating system 10 includes a pressurized liquid supply 38 that operates in a known manner under the command of controller 18 to generate a continuous stream or supply of the pressurized liquid coating material. For example, the pressurized liquid supply 38 may include a diaphragm or piston pump that siphons amounts of liquid coating material from a reservoir and then pumps the stream of liquid coating material under pressure from the reservoir through a fluid path to the applicator 16. The pressurized liquid supply 38 is electrically connected by a communication link 39 with the controller 18, which can regulate operating parameters such as the temperature and pressure of a liquid coating material by communicating appropriate control signals to the pressurized liquid supply 38 over communication link 39.

The pressurized liquid supply 38 is optionally configured with one or more conventional heating elements 38a that are electrically coupled with a conventional temperature controller 60 that is electrically coupled with the controller 18. The construction and operation of conventional heating elements, such as heater elements 38a, and temperature controllers, such as temperature controller 60, are understood by a person having ordinary skill in the art. In an alternative embodiment, the applicator 16 may include heating element (not shown) or a heating element (not shown) may be disposed in the one of the conduits 51, 53, 55. Regardless of the specific location of the heating element in the flow path between the pressurized liquid supply 38 and the nozzle 31, the liquid coating material may be heated in this flow path before being applied to the substrate 12.

The applicator 16 includes a liquid inlet 36 that is coupled in fluid communication with a pressurized liquid supply 38. The liquid coating material is supplied from the pressurized liquid supply 38 to the applicator 16 through the liquid inlet 36 for regulated dispensing out of a dispensing orifice (not shown) in the nozzle 31. The body 30 has a fluid inlet 40 coupled with pressurized fluid supply 32 and internal passageways (not shown) that direct the pressurized fluid to outlets in the vicinity of the dispensing orifice in nozzle 31, where the pressurized fluid is discharged to interact with and manipulate the stream 42 of liquid coating material that is sprayed from the applicator 16. A fluid regulator 43, which communicates over communication link 45 with motion controller 26, controls the flow of pressurized fluid from the pressurized fluid supply 32 to the fluid inlet 40. A representative applicator similar to applicator 16 is described in U.S. Pat. No. 7,028,867, the disclosure of which is hereby incorporated by reference herein in its entirety.

The system 10 is operated as instructed by a library of operational cycles or sequences that are stored in a memory 44 associated with the controller 18 and/or stored in other computers. The operational sequences are recalled and placed in a particular operational program, as desired, executing on the controller 18. The operational sequences can be adjusted to accommodate different environmental conditions, different types of substrates 12, or different types of conformal coating material. During operation, the controller 18 can transfer an entire operational program as electrical signals over communication link 25 to the motion controller 26 for execution at the motion controller 26. Alternatively, the controller 18 can transfer one or more instructions as electrical signals over communication link 25 in a batch of instructions and data to the motion controller 26 for subsequent execution. The operator may enter parameters, such as the type of substrate 12, the type of liquid coating material, the liquid pressure, the assist air pressure, the velocity of the applicator 16, the distance between the substrate 12 and applicator 16, etc., at the HMI device 19. The entered parameters are stored in the memory 44 of controller 18 for future use in an operational sequence. Each substrate 12 is matched by the controller 18 with a coating program that determines which specific components and areas of the substrate 12 are to be coated with liquid coating material. Typically, the liquid coating material is applied to only selected areas and/or components on the substrate 12.

With continued reference to the FIGURE, an "air over fluid" (A/F) regulator 50 and a flow meter 52 are situated in the flow path for the liquid coating material from the pressurized liquid supply 38 to the liquid inlet 36 of the applicator 16. As a result, the liquid coating material is constrained to flow through the A/F regulator 50 and flow meter 52 in transit from the pressurized liquid supply 38 to the applicator 16. A liquid input of the A/F regulator 50 is coupled by a conduit 51 with a liquid outlet of the pressurized liquid supply 38. Similarly, the A/F regulator 50 has a liquid outlet coupled by a conduit 53 with a liquid input of the flow meter 52, which in turn has a liquid outlet coupled by a conduit 55 with the liquid inlet 36 of the applicator 16.

The A/F regulator 50 controls the fluid pressure of the pressurized liquid material in transit in the fluid path to the applicator 16. The controller 18 is electrically coupled by a communication link 57 with a) regulator 54. In one embodiment, the regulator 54 may be a "voltage over pressure" (E/P) regulator that receives a control voltage from the motion controller 26 and includes a transducer that converts the control voltage to a fluid pressure. Alternatively, the regulator 54 may receive a control current or a serial communications signal, instead of a control voltage, for conversion to a fluid pressure. The regulator 54 delivers pressurized fluid to the A/F regulator 50 for use in controlling the fluid pressure of the liquid coating material flowing through the A/F regulator 50.

The A/F regulator 50 is positioned in a conduit 35 defining a fluid path between the pressurized liquid supply 38 and the flow meter 52. In an alternative embodiment, the flow meter 52 may be positioned in the fluid path between the pressurized liquid supply 38 and the A/F regulator 50 so that the flow meter 52 is upstream from the A/F regulator 50. With this alternative arrangement, the flow meter 52 would alter the pressure of the liquid coating material after the liquid coating material has flowed through the A/F regulator 50.

The controller 18 is electrically coupled by a communication link 59 with the flow meter 52. In response to the flow of liquid coating material from conduit 53 to conduit 55, the flow meter 52 generates a string of counts or electrical pulses each representing a fixed volume of liquid coating material flowing through or past the flow meter 52. Alternatively, the string of electrical pulses from the flow meter 52 may be communicated from the flow meter to the motion controller 26 and then relayed from the motion controller 26 to the controller 18. In one embodiment, the flow meter 52 may comprise a gear meter that rotates in response to flow through the gear meter and, for a fixed amount of rotation representing a known volume, generates an electrical pulse with an encoder that is transmitted as an electrical signal in a signal stream to the controller 18. For example, the gear meter may generate a pulse for every 0.04 cubic centimeters of liquid coating material flowing through the flow meter 52.

In use and with reference to the FIGURE, the controller 18 obtains a coating program for the substrate 12 when substrate 12 is properly positioned relative to the applicator 16. The coating program determines which components and/or areas of the substrate 12 are to be coated with liquid coating material, which is usually applied in strips. For example, possibly twenty-five separate components or areas of a substrate 12 may be coated with strips of the liquid coating material. The controller 18 retrieves an operational sequence from the memory 44 of controller 18 and, in turn, communicates control signals to the motion controller 26 over communication link 25 representing the operational sequence. The motion controller 26 sends command signals to the robot 14 over communication link 21 that instruct the robot 14 to move the applicator 16 at specified velocities to desired locations with respect to the substrate 12. The motion controller 26 controls the movements of the robot 14 to move the applicator 16 in a plane (e.g., X and Y directions) across the substrate 12, opening and closing the dispensing valve in the applicator 16 as necessary during this movement to apply the liquid coating material to the desired components and areas of the substrate 12.

Specifically, at any particular location on substrate 12, the motion controller 26 also provides a command signal to the solenoid 34 to cause it to change state to open the dispensing valve causing discharge of liquid coating material from nozzle 31. Concurrently, the motion controller 26 provides command signals to the robot 14 to initiate motion of applicator 16 relative to the substrate 12. The stream 42 of liquid coating material may be optionally manipulated by an assist fluid, such as air, that affects the shaping of the stream 42 discharged from the applicator 16. After a predetermined time lapses, the motion controller 26 subsequently changes the state of the valve command signal to return the solenoid 34 back to its original state. This action closes the dispensing valve to discontinue the discharge of liquid coating material from the nozzle 31 of the applicator 16. The motion controller 26 may cause the dispensing valve of the applicator 16 to open and close the dispensing valve multiple times (e.g., twenty-five times) during the extent of the coating program so that multiple components and areas of the substrate 12 receive an amount of liquid coating material.

During the coating program or in preparation for the execution of the coating program, the controller 18 provides electrical signals to the motion controller 26, which prompt the motion controller 26 to provide command signals to the regulator 54. The regulator 54 controls an air pressure supplied to the A/F regulator 50 to selecting a liquid pressure for the pressurized liquid coating material flowing from the pressurized liquid supply 38 to the applicator 16. The selected value of liquid pressure, which is dispensing application dependent, may further depend on the desired flow rate of the liquid coating material. The flow rate for the liquid coating material is influenced, among other factors, by the liquid pressure, the diameter of the discharge orifice in the dispensing nozzle 31, the material viscosity, etc.

Coating system 10 is significantly more accurate than conventional conformal coating systems because system 10 determines the volume of coating material dispensed over an entire substrate 12, which can be calculated relatively accurately, compares that calculated value to a set point, and makes a correction, if needed, based on this relatively accurate calculation.

At the start of each coating program for substrate 12, the controller 18 obtains an "encoder count" from the flow meter 52. For example, the controller 18 may consider the initial encoder count to be zero. During the coating program that applies the liquid coating material to the areas and components on substrate 12, the controller 18 receives the string of pulses from the flow meter 52 and incrementally accumulates a total number of pulses as the liquid coating material flows to the applicator 16. At the conclusion of the coating program for each substrate 12, the pulse string from the flow meter 52 ends. The controller 18 includes an accumulator that contains the total number of pulses communicated from the flow meter 52 during the coating program.

Based upon a known calibration of the amount of liquid coating material represented by each pulse generated by the flow meter 52, the controller 18 converts the total number of pulses to a total volume of liquid coating material dispensed onto the substrate 12. The controller 18 compares the total dispensed volume with a desired total dispensed volume and produces an error signal representing the difference between the calculated and desired dispensed volumes. As necessary and based upon the error signal, the controller 18 communicates a control signal to the motion controller 26, which supplies a control current, a control potential, or a control signal to the regulator 54 to manipulate the flow constriction represented by the A/F regulator 50 in order to compensate for the difference between the calculated and desired dispensed volumes of liquid coating material. Generally, the fluid pressure is set in proportion to the input current, potential, or control signal to the regulator 54.

If the total dispensed volume is too low, the control signal communicated from the controller 18 to the motion controller 26 causes the motion controller 26 to react by increasing the control potential applied to the E/P transducer 54. This action opens the A/F regulator 50 wider to increase the flow of liquid coating material to the applicator 16. If the total dispensed volume is too high, the control signal communicated from the controller 18 to the motion controller 26 causes the motion controller 26 to react by decreasing the control potential applied to the E/P transducer 54. This action causes the EP transducer 54 to react by closing the A/F regulator 50 to reduce the flow of liquid coating material to the applicator 16.

For subsequent substrates 12 that are coated by system 10 according to the coating program, the correction is in a direction that is predicted to reduce the error signal. As a result, the discrepancy between the total dispensed volume and desired total dispensed volume for subsequent substrates 12 should be reduced. If the error signal is not adequately compensated, additional corrections can be made as the calculated total dispensed volume is compared with the desired total dispensed volume. Each substrate 12 that is processed according to the coating program typically receives an identical total dispensed volume of liquid coating material on the areas and components.

The correction to the flow of liquid coating material under the closed loop control may be implemented by use of control windows in the software code executing on the controller 18. The inner control window represents the maximum permissible deviation from the desired total volume, either above or below the desired total volume, that if exceeded will initiate a responsive action by the controller 18. The outer control window represents the maximum permissible deviation from the desired total volume, either above or below the desired total volume, that if exceeded will initiate a response by the controller 18 that causes a drastic reaction, such as stopping the system 10 and/or sounding an alarm.

If the calculated total volume dispensed during the coating program is within a first percentage (e.g., ±1%) of the desired total dispensed volume, the controller 18 makes no correction within this inner control window. If the calculated total volume dispensed during the control program is more than a second percentage (e.g., ±10%) of the desired total dispensed volume, the controller 18 may stop the system 10 and/or sound an alarm outside of this outer control window as determined by the user's preference. The substrate 12 being coated when the coating operation deviates outside of the outer control window is flagged as having an out of tolerance conformal coating applied to it. If the calculated total volume dispensed during the coating program is between the inner and outer control windows, the controller 18 may correct the flow of liquid coating material to the applicator 16 within this intermediate control window without sounding an alarm. The correction, which is executed as described above, is of a magnitude and sense to counteract the out of tolerance condition. For example, the corrective action may be taken if the total dispensed volume is greater ±5% of the desired total dispensed volume.

In this way, any trends affecting total dispensed volume during a coating program are detected contemporaneously with their occurrence and responsive corrections are made as automatic intervention to offset the trend. Unless the control falls outside of the outer control window, the responsive corrections are implemented without operator intervention. For example, a change in the viscosity of the liquid coating material may cause the total dispensed volume to shift away from the desired total dispensed volume. The viscosity change is detected as a change in the total dispensed volume and, subsequently, is corrected by an action executed by the controller 18. System 10 assists the customer in maintaining a high quality liquid material coating operation by utilizing a relatively accurate dispensed volume calculation compared to conventional systems, while ensuring that the customer does not waste liquid coating material by applying more material than is necessary.

The controller 18 of the system 10 does not track or otherwise monitor the time interval required to dispense the liquid coating material onto the substrate 12 during the execution of the coating program. As such, the controller 18 does not calculate a volume flow rate for the liquid coating material dispensed onto each substrate 12 during the coating program.

In an alternative embodiment, the controller 18 may adjust the velocity of the robot 14 as a control parameter to adjust the total dispensed volume of coating material dispensed from the applicator 16 onto the substrate 12. For example, if the controller 18 determines that the total dispensed volume is less than the desired volume, then the controller 18 could reduce the velocity of the robot 14 by an amount effective to compensate for the discrepancy that effectively increases the total amount of liquid coating material dispensed onto the areas or components of the substrate 12. Conversely, if the controller 18 determines that the total dispensed volume is greater than the desired volume, then the controller 18 could increase the velocity of the robot 14 by an amount effective to compensate for the discrepancy that effectively decreases the total amount of liquid coating material dispensed onto the areas or components of the substrate 12.

In another alternative embodiment, the controller 18 may adjust the temperature of the liquid coating material as a control parameter to adjust the total dispensed volume. To that end, the controller 18 would communicate electrical signals to the pressurized liquid supply 38 that command the pressurized liquid supply 38 to heat or to cool the liquid coating material. As known to a person having ordinary skill in the art, changing the temperature of the liquid coating material changes its viscosity. For example, if the total dispensed volume dispensed from the applicator 16 onto the substrate 12 is too low, the temperature of the liquid coating material is increased to decrease its viscosity and, thereby, create a higher flow of liquid coating material to the applicator 16. This will operate to increase the amount of liquid coating material dispensed onto the areas or components of the substrate 12 during the coating program. Conversely, if the total dispensed volume dispensed from the applicator 16 onto the substrate 12 is too high, the temperature of the liquid coating material is decreased to increase its viscosity and, thereby, reduce the flow of liquid coating material to the applicator 16. This will operate to decrease the amount of liquid coating material dispensed onto the areas or components of the substrate 12 during the coating program.

Robot velocity and coating material temperature are variables that are independent of the fluid pressure of the liquid coating material. Therefore, a separate control loop could utilize fluid pressure from the pressurized fluid supply 32 to, for example, manipulate the stream 42 to achieve a desired fan width of a spray pattern from the applicator 16 while, concurrently, the volume of liquid coating material being dispensed onto the substrate 12 is maintained near the desired set point by varying robot velocity or coating material temperature.

While the invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and methods and illustrative examples shown and described. Accordingly, departures may be made from such details without departing from the scope or spirit of Applicants' general inventive concept.

What is claimed is:

1. A method of applying conformal coating material from an applicator to a plurality of desired components and areas of an electronic circuit board as determined by a coating program, the method comprising:

obtaining the coating program that identifies locations of the desired components and areas of the circuit board to be coated;

obtaining an operational sequence from the coating program that is used to move the applicator to the locations of the desired components and areas of the circuit board;

communicating control signals that represent the operational sequence to a motion controller;

sending command signals based upon the control signals from the motion controller to a robot that moves the applicator to the locations of the desired components and areas of the circuit board;

opening and closing a dispensing valve of the applicator at each of the desired components or areas of the circuit board while the applicator is moved over and dispenses an amount of the conformal coating material from the applicator to each of the desired components and areas of the circuit board as directed by the coating program;

totaling the amounts of conformal coating material applied to each of the desired components and areas of the circuit board to determine a total dispensed volume of the conformal coating material applied to the circuit board;

comparing the total dispensed volume of the conformal coating material applied to the circuit board to a desired dispensed volume of the conformal coating material specified by the coating program; and changing the total dispensed volume of the conformal coating material applied to a subsequent circuit board based upon a comparison of the total dispensed volume of the conformal coating material applied to the circuit board to the desired dispensed volume of the conformal coating material specified by the coating program.

2. The method of claim 1 wherein changing the total dispensed volume of the conformal coating material further comprises:

regulating the flow of the conformal coating material to the applicator with a regulator.

3. The method of claim 1 wherein changing the total dispensed volume of the conformal coating material further comprises:

implementing an inner control window for changing the total dispensed volume; and taking no action if the difference between the total dispensed volume and the desired dispensed volume of the conformal coating material specified by the coating program is within the inner control window.

4. The method of claim 3 wherein changing the total dispensed volume of the conformal coating material further comprises:

adjusting a temperature of the conformal coating material based upon an error signal when dispensing the conformal coating material onto another circuit board.

5. The method of claim 3 wherein changing the total dispensed volume of the conformal coating material further comprises:

adjusting a velocity at which the applicator is moved relative to the circuit board when dispensing the conformal coating material onto another circuit board.

6. The method of claim 1 wherein changing the total dispensed volume of the conformal coating material further comprises:

implementing an outer control window for changing the total dispensed volume; and generating an alarm if the difference between the total dispensed volume and the desired dispensed volume of the conformal coating material specified by the coating program is outside of the outer control window.

7. The method of claim 1 wherein changing the total dispensed volume of the conformal coating material further comprises:

implementing an outer control window for changing the total dispensed volume; and stopping the flow of conformal material to the applicator if the difference between the total dispensed volume and the desired dispensed volume of the conformal coating material specified by the coating program is outside of the outer control window.

8. The method of claim 1 wherein changing the total dispensed volume of the conformal coating material further comprises:
adjusting a temperature of the conformal coating material based upon an error signal when dispensing the conformal coating material onto another circuit board.

9. The method of claim 1 wherein changing the total dispensed volume of the conformal coating material further comprises:
adjusting a velocity at which the applicator is moved relative to the circuit board when dispensing the conformal coating material onto another circuit board.

10. The method of claim 1 wherein determining the total dispensed volume further comprises:
generating volume signals representing volumes of the conformal coating material flowing to the applicator; and
determining the total dispensed volume based on the volume signals.

11. The method of claim 1 further comprising:
communicating the volume signals to a controller that determines the total dispensed volume and compares the total dispensed volume to the desired dispensed volume to determine the difference between the total dispensed volume and the desired dispensed volume of the conformal coating material specified by the coating program; and
communicating a control signal to a regulator for changing the total dispensed volume of the liquid coating material on the subsequent circuit board.

* * * * *